(12) United States Patent
Hoskins

(10) Patent No.: US 6,954,168 B2
(45) Date of Patent: Oct. 11, 2005

(54) ACTIVE LOAD CLAMP FOR A TRACK-AND-HOLD CIRCUIT

(75) Inventor: Michael J. Hoskins, Monument, CO (US)

(73) Assignee: Q-Dot, Inc., Colorado Springs, CO (US)

( * ) Notice: Subject to any disclaimer, the term of this patent is extended or adjusted under 35 U.S.C. 154(b) by 0 days.

(21) Appl. No.: 10/848,200

(22) Filed: May 18, 2004

(65) Prior Publication Data

US 2005/0007158 A1 Jan. 13, 2005

Related U.S. Application Data

(60) Provisional application No. 60/472,076, filed on May 20, 2003, and provisional application No. 60/472,081, filed on May 20, 2003.

(51) Int. Cl.[7] .............................................. H03M 1/12
(52) U.S. Cl. ..................................... 341/155; 327/94
(58) Field of Search .................................. 327/321, 362, 327/96, 94; 341/155

(56) References Cited

U.S. PATENT DOCUMENTS

| | | | | | |
|---|---|---|---|---|---|
| 3,659,117 A | * | 4/1972 | Caveney et al. | ............ | 327/321 |
| 5,180,932 A | * | 1/1993 | Bengel | ........................ | 327/362 |
| 5,291,074 A | * | 3/1994 | Nayebi | ........................ | 327/96 |
| 5,734,276 A | * | 3/1998 | Abdi et al. | ..................... | 327/94 |

* cited by examiner

Primary Examiner—Jean Bruner Jeanglaude
(74) Attorney, Agent, or Firm—Welsh & Katz, Ltd.

(57) ABSTRACT

A method and apparatus are provided for tracking and holding a voltage. The method includes the steps of providing an external analog voltage on an input of the track and hold circuit during a tracking mode of the track and hold circuit, storing a representation of the sampled external voltage in a storage device of the track and hold circuit, blocking a signal path between the external voltage and the storage device during a holding mode of the track and hold circuit and clamping the input of the track and hold circuit to a predetermined voltage during the holding mode.

33 Claims, 4 Drawing Sheets

ACTIVE LOAD CLAMP FOR A TRACK-AND-HOLD CIRCUIT

This application is a continuation-in-part of U.S. Provisional Patent Application Ser. Nos. 60/472,076 and 60/472,081, both filed on May 20, 2003.

FIELD OF THE INVENTION

The field of the invention relates to signal sampling devices and more particularly to track-and-hold circuits for analog-to-digital converters.

BACKGROUND OF THE INVENTION

Track-and-hold circuits are generally known. Such devices are used in conjunction with analog-to-digital converters (ADC) in sampling circuits. Sampling circuits are typically used to sample relatively high frequency input signals (e.g. in the megahertz range).

In effect, ADCs require a relatively constant input voltage during a measurement cycle to obtain an accurate measurement. However, if an input signal is varying, then the ADC cannot obtain accurate signal measurements. In order to solve this problem, track-and-hold circuits are used in conjunction with ADCs in sampling circuits.

Track-and-hold circuits operate by capturing an analog input signal during a first tracking mode and holding the captured signal at a relatively constant voltage during a second, holding mode while the ADC measures the captured signal. During the tracking mode, the track-and-hold circuit may couple the input signal to a capacitor of the track-and-hold circuit. During the track mode, the input signal charges the capacitor to a voltage equal to that of the input signal.

During a second, holding mode, a transistor of the track-and-hold circuit blocks a signal path between the signal storage device and input signal. During the second mode, the track-and-hold circuit presents a relatively constant voltage to the ADC for signal measurement.

While track-and-hold circuits work relatively well, their performance is degraded in certain situations involving rapidly varying signals. For example, a rapidly varying signal on a blocking transistor inherently results in signal leakage through the blocking transistor. Because of the importance of track-and-hold circuits, a need exists for a method of preventing signal leakage through the blocking transistor.

SUMMARY

A method and apparatus are provided for tracking and holding a voltage. The method includes the steps of providing an external analog voltage on an input of the track and hold circuit during a tracking mode of the track and hold circuit, storing a representation of the sampled external voltage in a storage device of the track and hold circuit, blocking a signal path between the external voltage and the storage device during a holding mode of the track and hold circuit and clamping the input of the track and hold circuit to a predetermined voltage during the holding mode.

DETAILED DESCRIPTION OF AN ILLUSTRATED EMBODIMENT

Figure 1:
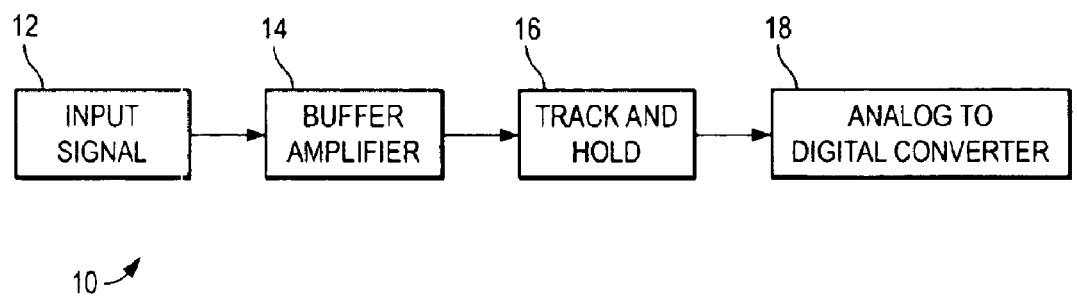
FIG. 1 depicts a sampling system in accordance with an illustrated embodiment of the invention.

FIG. 1 is a block diagram of a sampling circuit 10 in accordance with an illustrated embodiment of the invention. Included within the sampling circuit 10 may be a buffer amplifier 14, a track and hold (T/H) circuit 16 and an ADC 18. As used herein, a track and hold circuit means a device that samples an analog voltage from an external source during a first tracking state and maintains a relatively constant representation of that sampled voltage in an internal storage device during a hold state.

Figure 2:
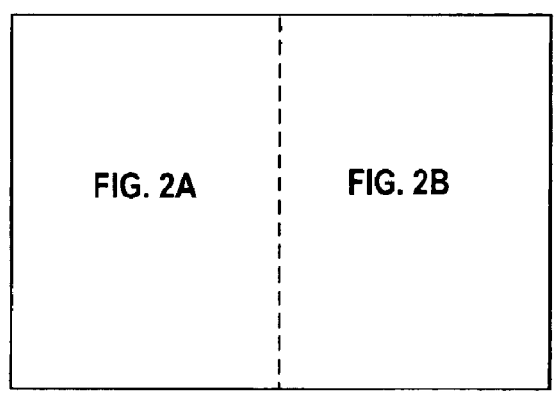
FIG. 2, comprising
Figure 2A:
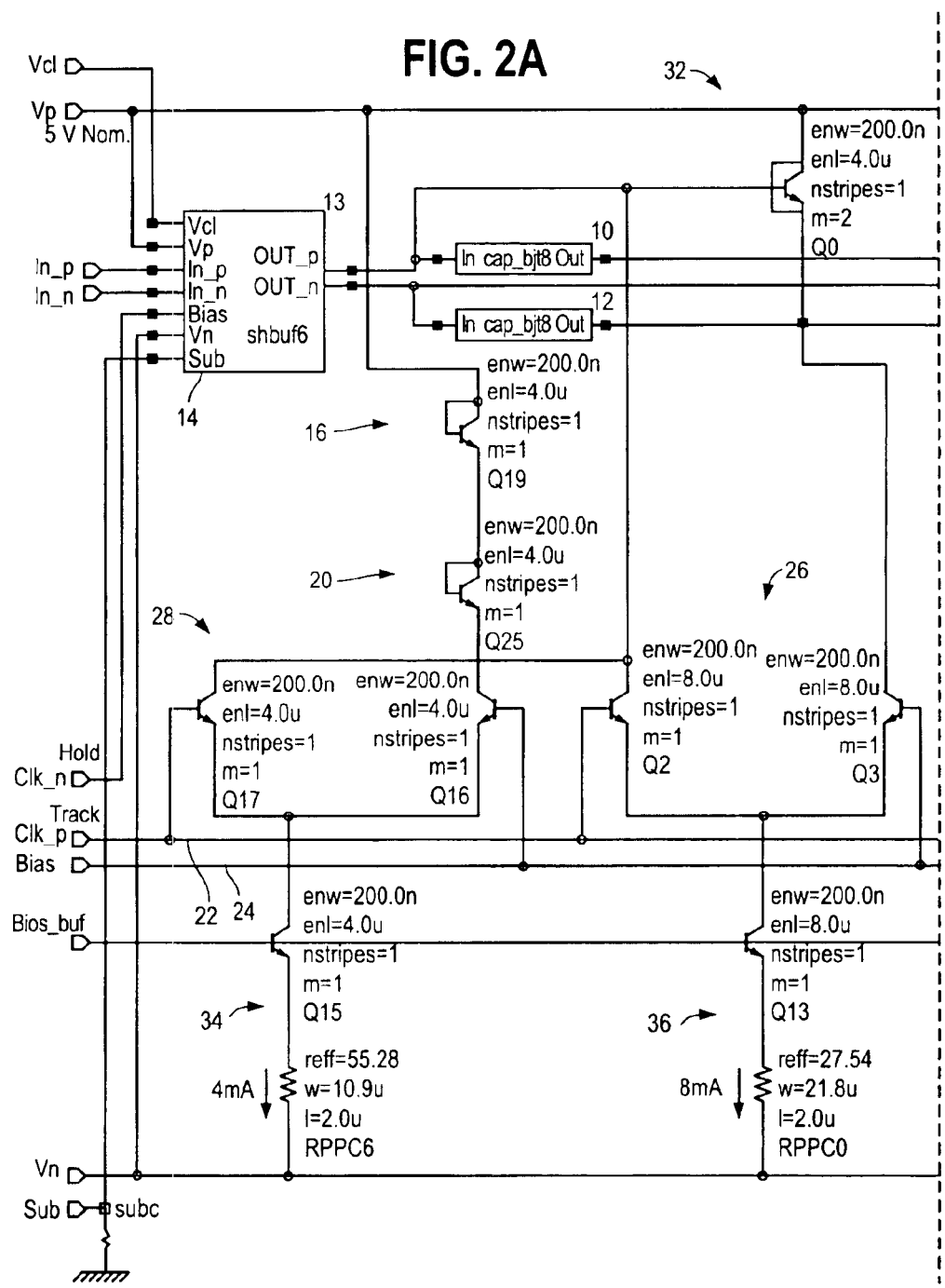
FIG. 2A and FIG. 2B, depicts a schematic of a buffer amplifier and track and hold circuit of FIG. 1.
Figure 2B:
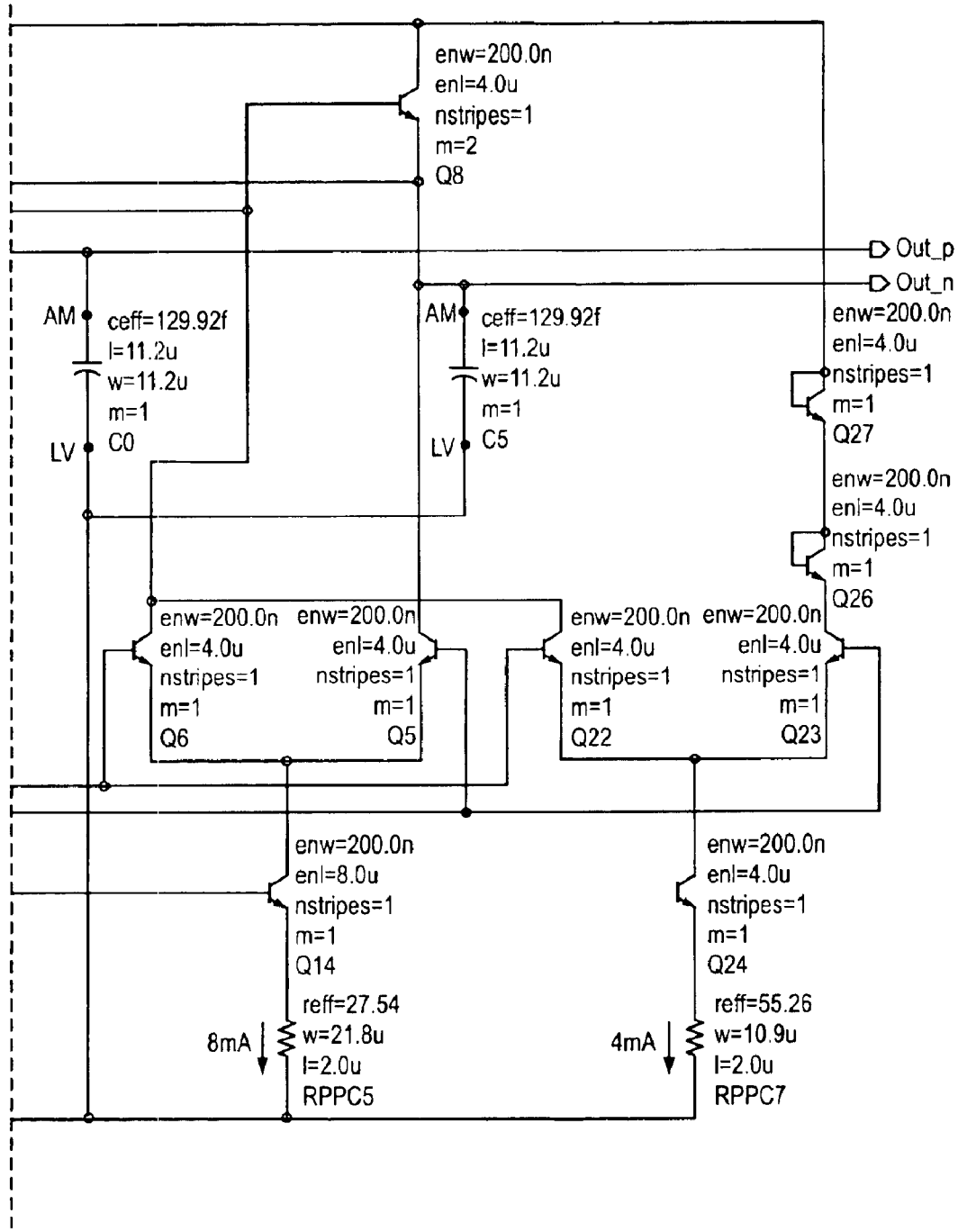
Figure 3:
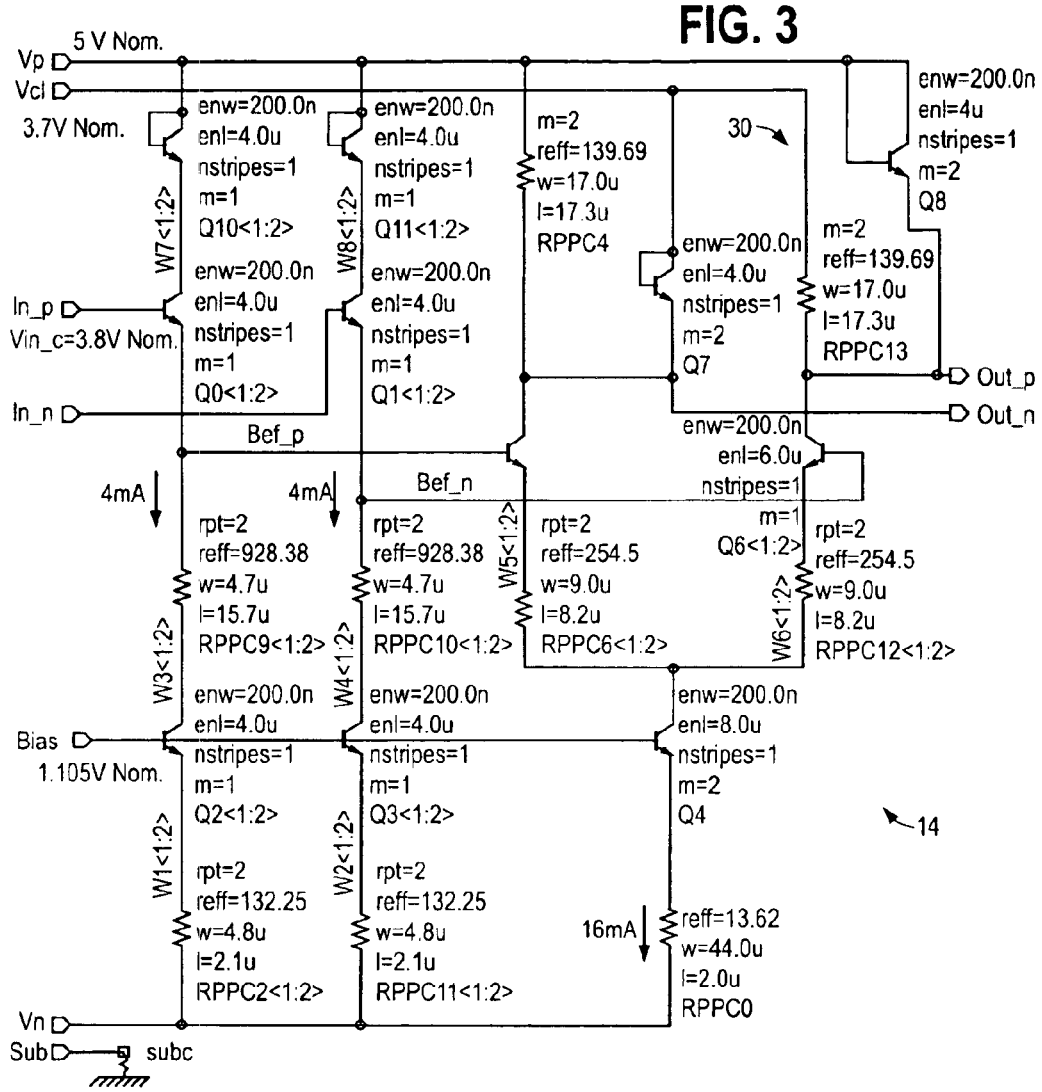
FIG. 3 depicts a schematic of a buffer amplifier of FIGS. 1 and 3.

FIG. 2 is a schematic that depicts the buffer amplifier 14 and T/H circuit 16 of FIG. 1. FIG. 3 is a schematic of the buffer amplifier 14.

Under the illustrated embodiment, the buffer amplifier 14 and T/H circuit 16 are provided with a clamping circuit 20 that clamps an input of the T/H circuit 16 to a predetermined voltage during a hold mode of the T/H circuit 16. Clamping the input of the T/H circuit 16 to a predetermined voltage has been found to substantially improve the performance and bandwidth of the sampling circuit 10.

In general, an analog input signal from a signal source 12 is converted into a differential output signal within the buffer amplifier 14 and transferred to the T/H circuit 16 on outputs Out_p and Out_n of FIG. 3. Within the buffer amplifier 14 (FIG. 3) a pair of emitter-follower transistors Q0 and Q1 provide a first quasi-differential amplifier for the input signal. An output of the first differential amplifier (Bef_n and Bef_p) are provided as an input to a second amplifier stage. The second amplifier stage, provided by transistors Q5 and Q6, may be referred to as a degenerated differential pair. Resistor RPPC0 and transistor Q4 form a current source (sink). RPPC6, RPPC12 are emitter degeneration resistors. Resistors RPPC4 and RPPC13 and transistors Q7 and Q8 form a portion of clamping circuits 20 (as discussed in more detail below).

In tracking mode, differential switch transistors Q3 and Q5 and Q16 and Q23 (FIG. 2) are "on" while transistors Q2 and Q6 and Q17 and Q22 are "off", thus biasing the emitter-followers Q0 and Q8 in their normal quiescent current region. The output of the buffer amplifier 14 (Out_P and Out_n) is applied to the bases of emitter-follower switches Q0 and Q8 of track and hold sub-circuit 32. During the tracking portion of the track and hold process, switches Q0 and Q8 function to impose a charge on charge storage devices (e.g., capacitors C0 and C5) in direct relationship to the input voltage from the buffer amplifier (i.e., from outputs Out_p and Out_n).

During the hold portion of the track and hold process, the current switches cut off the current to the Q0 and Q8 emitter-follower transistors, float the emitters and hence the hold capacitor nodes. At the same time, the current switches sink current at the bases of Q0 and Q8 helping to discharge the base-emitter junctions rapidly so that the "on" to "off" transition of the Q0 and Q8 transistors is very fast. The sink current is also pulled through the output impedance of the buffer amplifier and the resulting voltage drop on the bases ensures that Q0 and Q8 are completely deactivated. Once switches Q0 and Q8 are deactivated, they block a signal path between the buffer amplifier 14 and the capacitors C0 and C5.

The total hold capacitance of the track and hold subcircuits is comprised of parasitics and MIM capacitors C0 and C5. Current switch transistors Q2, Q3, Q16 and Q17 realize current switching between track-and-hold modes for Q0 while Q5, Q6, Q22 and Q23 perform this function for Q8.

Figure 4:
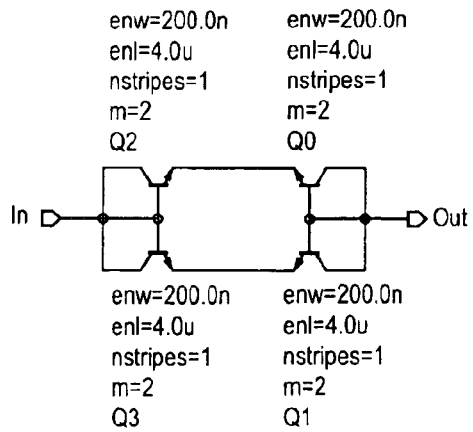
FIG. 4 depicts a schematic of the feed forward circuit of FIG. 2.

A pair of feed forward compensators cap_bjt8 partially cancel any feedthrough voltage error by cross-coupling the base-emitters of Q0 and Q8. A schematic of the feed forward compensators cap_bjt8 is shown in FIG. 4. The compensators provide a series/parallel combination of junctions that emulate the base-emitter capacitance of Q0 and Q8.

The buffer amplifier 14 and T/H circuit 16 are designed to operate in the 4 GHz region. At these high frequencies, the tradeoff between bandwidth, linearity, hold-mode droop and hold-mode feed-through becomes more severe. The maintenance of high linearity in the switched emitter-follower transistors driving the hold capacitor requires high current drive, which, in turn, requires large transistors Q0 and Q8. In particular, the base-emitter junction nonlinearity induces $3^{rd}$ order products generated by the emitter-follower driving the hold capacitance and which are proportional to $(fC_h/I_e)^3$ where $I_e$ is the emitter-follower quiescent current, $C_h$ is the hold node capacitance, and f is the signal frequency. This serves as an impetus to minimize the hold capacitance while maximizing the quiescent current, but this aggravates hold-mode droop. The increased capacitive loading on the preamplifier associated with large transistors Q0 and Q8 reduces bandwidth. An even more difficult issue arises from the fact that large emitter-follower transistors result in a substantial off-state coupling capacitance to the hold capacitor, contributing to substantial hold-mode feed-through. Hence, increased linearity in the switched emitter follower is obtained at the expense of bandwidth, droop, and hold-mode feed-through.

Another issue that arises in the switched emitter-follower track-and-hold design is that the current bias required to optimize the switched emitter-follower transistors is not necessarily compatible with that required to produce the proper track-to-hold transition cutoff voltage in the preamplifier load resistors. This is found to be the case when the bandwidth of the input buffer is extended to high frequencies with high operating current to maximize linearity. The low value of input buffer output load resistance needed to maintain a small output node time constant requires more current for the track-hold cutoff transition than would be optimal for the switched emitter-follower bias.

These issues may be addressed with two new features incorporated into the switched emitter-follower topology. First, the track-mode quiescent current/hold-mode cutoff current discrepancy is addressed with additional current switches Q16 and Q17 and Q22 and Q23 that increase the hold-mode cutoff current by as much as 50% while leaving the switched emitter-follower quiescent current unchanged. This provides an additional degree of freedom to optimize the switched emitter-follower stage operating point and linearity while simultaneously allowing optimization of the bandwidth and linearity of the buffer amplifier. Second, as shown in the input buffer amplifier schematic of FIG. 3, a new diode clamping circuit comprised of diode connected transistors Q7 and Q8 is utilized to radically lower the effective buffer amplifier load impedance during hold mode. The supply voltage to these diodes is established such that they are essentially off during track-mode. In hold-mode they conduct a portion of the current that would normally flow through the load resistors creating a dynamic impedance that shunts the resistors and substantially lowers the buffer amplifier gain. Simulations show that this feed-through rejection feature provides an order of magnitude improvement in feed-through levels relative to what would be obtained with the feed-through compensation capacitors by themselves. This feature enables the track/hold circuit to operate at a very broad bandwidth with good linearity while maintaining low feed-through levels.

Returning now to the figures, in order to further eliminate voltage feedthrough, clamping circuits 20, (operating under control of a set of track and hold control connections 22, 24) may be provided to activate and deactivate the switches Q0 and Q8. In this regard, substantially identical clamp circuits 20 may be provided in the positive and negative sides of the signal path. For purposes of simplicity, the operation of the positive side of the clamp circuit 20 will be described. It should be understood that the clamp circuit 20 on the negative side of the signal path operates in substantially the same manner.

The clamping circuit 20 on the positive side may include a differential current switch assembly 26, an auxiliary current switch 28 (shown in FIG. 2) and a clamping diode assembly 30 (shown in FIG. 3). The differential current switch assembly 26 may include transistors Q2 and Q3 and a constant (tracking) current source (sink) (i.e., transistor Q13 and resistor RPPC0) 36 that sinks 8 mA.

During the tracking mode, the tracking control connection Clk_p is high (i.e., assumes a logical value of 1) and Clk_n is low (i.e., assumes a logical value of 0). The effect of the high value on Clk_p causes transistor Q3 to conduct and transistor Q2 of the differential current switch assembly 26 to be in an off state.

Similarly, the auxiliary current switch 28 may include transistors Q17 and Q18 and a constant (helper) current source (sink) (i.e., transistor Q15 and resistor RPPC6) 34 that sinks 4 mA. During the tracking mode, transistor Q16 is in a conductive state and transistor Q17 is in an off state.

During the tracking state, switch Q0 is biased into a linear portion of its operating range by current switching transistor Q3 and the constant current source. Because of its biasing characteristics, switch Q0 can be assumed to have an amplification factor of 1. With an amplification of 1, the capacitor C0 very closely tracks the input voltage.

During the hold mode, the control connection Clk_p goes low and Clk_n goes high. Due to this signal transition, transistors Q3 and Q16 become deactivated and transistors Q2 and Q17 becomes activated. Activation of transistors Q2 and Q17 pulls the base of the switch Q0 downwards to a predetermined voltage determined by the clamping diode assembly 30 of FIG. 3.

The diode assembly 30 shown in FIG. 3 may include a transistor Q8 and resistor RPPC13. RPPC13 may have a value of 139 ohms and be connected between Vp (supply voltage of 5 volts) and Out_p.

Transistor Q8 has its base connected to its collector, thereby allowing the transistor Q8 to function essentially as a diode. The transistor Q8 is connected between Out_p and Vcl. Vcl may have a nominal voltage of 3.7 volts.

During the tracking state, current flows through the resistor RPPC13, but does not flow through the transistor Q8. Limiting current flow to the resistor RPPC13 provides a linear relationship between the driving signal (Bef_p-Bef_n) and the output signal on Out_p.

During the hold state, activation of transistors Q2 and Q17 (FIG. 2) pulls the connection Out_p low because current sources 34, 36 within the differential current switch 26 and auxiliary switch 28 sink a total of 12 mA. The 12 mA is provided by the diode clamping assembly 30.

The base to emitter voltage of the diode of Q8 of FIG. 3 has been found to be about 0.9 volts (for a silicon germanium hetero-junction bipolar transistor). With a voltage drop of 0.9 volts and a Vcl voltage of 3.7 volts, the signal connection Out_p would assume a value of 2.8 volts.

With a Vp value of 5 volts and an Out_p value of 2.8 volts, the voltage drop across RPPC13 is 2.2 volts. With a resistance value of 139.67 ohms, the current through RPPC13 would be approximately 15 mA.

The reader should note, in this regard, that the 15 mA through RPPC13 is the total current being drawn by all devices. For example, the second amplifier stage contains a current source (Q4, RPPC0) that sinks 16 mA. In a quiescent condition, RPPC13 would be expected to source one-half of that current, or 8 mA, to current source Q4. As a result, and during the hold mode, the 12 mA being drawn by the differential current switch assembly 26, and auxiliary current switch 28 would be divided between RPPC13 and diode Q8. Since the voltage across the diode Q8 is not current dependent, 7 mA of the 12 mA would be drawn from RPPC13 and 5 mA of the 12 mA would be provided by the diode Q8.

Because diode Q8 in the hold mode has an incremental voltage change of virtually zero volts for an incremental change in current, the diode Q8 also functions as a low impedance filter that reduces (filters out) any input signal from the source 12 in the second amplification stage by over 25 dB during the hold mode. The net result is that the clamping circuit 20 clamps the input of the track-and-hold sub-circuit 32 to the predetermined voltage of 2.8 volts and virtually eliminates the input signal during the hold mode.

The operation of the clamp diode and buffer amplifier can also be visualized from the viewpoint of AC small signal operation. In the hold mode, the clamp diode is forward biased, producing a relatively small AC signal impedance (5–10 ohms) that is much smaller than the value of the load resistor RPPC13. The resulting parallel combination of the resistor RPPC13 and the forward biased clamp diode provide an AC impedance that reduces the total collector load impedance. Since the gain of the Q5/Q6 differential pair is determined by the product of the differential transconductance and the collector load impedance, the significant reduction of the collector load impedance in the hold mode radically reduces the gain of the Q5/Q6 differential pair during the hold mode. This reduction in gain attenuates the signal, thereby providing a significant reduction in the feed-through signal applied to the track and hold sub-circuit 32 during the hold mode.

It should be noted that while the auxiliary current switch 28 performs substantially the same function as that of the differential current switch assembly 26 in the hold mode, it would not be possible to combine the two circuits. The reason is that the current sinking requirement during the track mode is different than the current sinking requirement during the hold mode.

In this regard, the transistor Q0 may be sized with a base region that is proportional to the size of the capacitor C0. The current sink 36 is then sized to allow the transistor Q0 to operate in a linear region of its operating range. If the base region of the transistor Q0 were instead sized for the total current sinking requirements of the clamp circuits 20 (i.e., 12 mA), then the transistor Q0 would be much larger than necessary. Making the base region of the transistor Q0 larger than necessary would increase the base-to-emitter capacitance, thereby increasing the feedthrough signal to the capacitor C0.

A specific embodiment of method and apparatus for operating a track and hold circuit has been described for the purpose of illustrating the manner in which the invention is made and used. It should be understood that the implementation of other variations and modifications of the invention and its various aspects will be apparent to one skilled in the art, and that the invention is not limited by the specific embodiments described. Therefore, it is contemplated to cover the present invention and any and all modifications, variations, or equivalents that fall within the true spirit and scope of the basic underlying principles disclosed and claimed herein.

What is claimed is:

1. A method of tracking and holding a voltage, such method comprising the steps of:
   providing an external analog voltage to an input of a track and hold circuit during a tracking mode of the track and hold circuit;
   storing a representation of the sampled external voltage in a storage device of the track and hold circuit during the tracking mode;
   blocking a signal path between the external voltage and the storage device during a holding mode of the track and hold circuit; and
   clamping the input of the track and hold circuit to a predetermined voltage during the holding mode.

2. The method of tracking and holding a voltage as in claim 1 wherein the step of storing the representation further comprises coupling the input signal to the storage device through an emitter-follower transistor.

3. The method of tracking and holding a voltage as in claim 2 further comprising coupling a collector of the emitter-follower transistor to a supply voltage and an emitter of the emitter-follower transistor to the storage device.

4. The method of tracking and holding a voltage as in claim 3 further comprising coupling a tracking current sink in parallel with the storage device.

5. The method of tracking and holding a voltage as in claim 4 further comprising defining the storage device as a capacitor.

6. The method of tracking and holding a voltage as in claim 5 wherein the step of blocking further comprises disconnecting the tracking current sink from its parallel connection with the storage device.

7. The method of tracking and holding a voltage as in claim 6 wherein the step of clamping further comprises reconnecting the tracking current sink to a base of the emitter-follower transistor during the holding mode.

8. The method of tracking and holding a voltage as in claim 7 wherein the step of clamping further comprises coupling a helper current sink to the base of the emitter-follower circuit.

9. The method of tracking and holding a voltage as in claim 8 wherein the step of clamping the input to the predetermined voltage further comprises coupling a filtering device between a voltage reference and the input.

10. The method of tracking and holding a voltage as in claim 9 wherein the step of coupling the filtering device between the voltage reference and the input further comprises coupling a diode between a first voltage reference and the input.

11. The method of tracking and holding a voltage as in claim 10 wherein the step of coupling the filtering device between the voltage reference and the input further comprises coupling a resistor coupled between the input and a second voltage reference.

12. An apparatus for tracking and holding a voltage, such apparatus comprising:

means for providing an external analog voltage to an input of a track and hold circuit during a tracking mode of the track and hold circuit;

means for storing a representation of the sampled external voltage in a storage device of the track and hold circuit during the tracking mode;

means for blocking a signal path between the external voltage and the storage device during a holding mode of the track and hold circuit; and means for clamping the input of the track and hold circuit to a predetermined voltage during the holding mode.

13. The apparatus for tracking and holding a voltage as in claim 12 wherein the means for storing the representation further comprises means for coupling the input signal to the storage device through an emitter-follower transistor.

14. The apparatus for tracking and holding a voltage as in claim 13 further comprising means for coupling a collector of the emitter-follower transistor to a supply voltage and an emitter of the emitter-follower transistor to the storage device.

15. The apparatus for tracking and holding a voltage as in claim 14 further comprising means for coupling a tracking current sink in parallel with the storage device.

16. The apparatus for tracking and holding a voltage as in claim 15 further comprising defining the storage device as a capacitor.

17. The apparatus for tracking and holding a voltage as in claim 16 wherein the means for blocking further comprises means for disconnecting the tracking current sink from the storage device.

18. The apparatus for tracking and holding a voltage as in claim 17 wherein the means for clamping further comprises means for connecting the tracking current sink to a base of the emitter-follower transistor during the holding mode.

19. The apparatus for tracking and holding a voltage as in claim 18 wherein the means for clamping further comprises means for coupling a helper current sink to the base of the emitter-follower circuit.

20. The apparatus for tracking and holding a voltage as in claim 19 wherein the means for clamping the input to the predetermined voltage further comprises means for coupling a filtering device between a voltage reference and the input.

21. The apparatus for tracking and holding a voltage as in claim 20 wherein the means for coupling the filtering device further comprises a diode coupled between a first voltage reference and the input.

22. The apparatus for tracking and holding a voltage as in claim 21 wherein the means for coupling the filtering devices further comprises a resistor coupled between the input and a second voltage reference.

23. A track and hold circuit for tracking and holding a voltage, such apparatus comprising:

an external analog voltage coupled to an input of the track and hold circuit during a tracking mode of the track and hold circuit;

a storage device adapted to store a representation of the external analog voltage during the tracking mode;

a blocking circuit that blocks a signal path between the external voltage and the storage device during a holding mode of the track and hold circuit; and a clamping circuit that clamps the input of the track and hold circuit to a predetermined voltage during the holding mode.

24. The apparatus for tracking and holding a voltage as in claim 23 wherein the means for storing the representation further comprises a first emitter-follower transistor that couples the input signal to the storage device.

25. The apparatus for tracking and holding a voltage as in claim 24 further comprising a collector of the first emitter-follower transistor coupled to a supply voltage and an emitter of the first emitter-follower transistor to the storage device.

26. The apparatus for tracking and holding a voltage as in claim 25 further comprising a tracking current sink coupled in parallel with the storage device.

27. The apparatus for tracking and holding a voltage as in claim 26 further comprising defining the storage device as a capacitor.

28. The apparatus for tracking and holding a voltage as in claim 27 wherein the blocking circuit further comprises a second transistor that open circuits the tracking current sink.

29. The apparatus for tracking and holding a voltage as in claim 28 further comprising a third transistor that connects the tracking current sink to a base of the emitter-follower circuit during the holding mode.

30. The apparatus for tracking and holding a voltage as in claim 29 further comprises a helper current sink that is coupled to the base of the emitter-follower circuit during the holding mode.

31. The apparatus for tracking and holding a voltage as in claim 30 further comprising a filtering device coupled between a voltage reference and the input to the track and hold circuit.

32. The apparatus for tracking and holding a voltage as in claim 31 wherein the filtering device further comprises a diode coupled between a first voltage reference and the input.

33. The apparatus for tracking and holding a voltage as in claim 32 wherein the filtering devices further comprises a resistor coupled between the input and a second voltage reference.

* * * * *